United States Patent [19]
Suri et al.

[11] Patent Number: 5,587,686
[45] Date of Patent: Dec. 24, 1996

[54] TIME DOMAIN SIGNAL FILTER

[75] Inventors: Salil Suri, Fremont; Sassan Teymouri, Saratoga, both of Calif.

[73] Assignee: Adaptec, Inc., Milpitas, Calif.

[21] Appl. No.: 300,284

[22] Filed: Sep. 2, 1994

[51] Int. Cl.$^6$ .................... H03K 5/00; H03K 9/06
[52] U.S. Cl. .................... 327/552; 327/551; 327/34; 327/36; 327/311; 327/379; 326/30; 326/36
[58] Field of Search .................... 327/520, 551, 327/34, 36, 310, 311, 263, 552, 165, 261, 262, 109, 205, 379; 326/30, 94, 36

[56] References Cited

U.S. PATENT DOCUMENTS

| 4,002,990 | 1/1977 | Roney | 327/36 |
| 5,059,834 | 10/1991 | Tago et al. | 327/310 |

FOREIGN PATENT DOCUMENTS

| 0107120 | 2/1989 | Japan | 327/34 |

OTHER PUBLICATIONS

"Pulse width discriminator", Fox, New Election, vol. 10, No. 6, 22 Mar. 1977.

Primary Examiner—Timothy P. Callahan
Assistant Examiner—Dinh T. Le
Attorney, Agent, or Firm—Skjerven, Morrill, MacPherson, Franklin & Friel; Forrest E. Gunnison; Omkar K. Suryadevara

[57] ABSTRACT

A time domain signal filter detects a change in an input signal and replaces the input signal with an internally generated substitute signal for a filter period. The filter period is user selectable and can be set through a bit in a hardware register. After passage of the filter period, the time domain signal filter resumes direct supply of the input signal as the output signal. The time domain signal filter determines the start of the filter period by using either the falling edge or the rising edge of the clock input, whichever edge comes first after detecting the change in the input signal.

21 Claims, 12 Drawing Sheets

TIME DOMAIN SIGNAL FILTER

FIELD OF THE INVENTION

This invention generally relates to eliminating the effects of signal reflections and in particular to a time domain signal filter for eliminating spurious events caused by reflections of a signal on a SCSI bus signal line.

BACKGROUND OF THE INVENTION

Reflection of a signal 100 (FIG. 1A) in a transmission line, such as a control signal line of a SCSI bus, results in distortions in the signal waveform because the reflected signal is added to or subtracted from the incident signal. FIG. 1A shows an example of a waveform having irregularities caused by reflections during deassertion of an active low signal. Notice that instead of the desired single rising edge on deassertion, signal 100 has multiple rising edges 100A and 100B. Multiple rising edges, which result from reflections of the incident signal, can indicate one or more false deassertions to a circuit receiving signal 100. (See FIG. 1B).

Typically, reflected signals are caused by a mismatch of the impedance between the signal line and either or both of the sending and receiving circuits. To eliminate impedance mismatches, terminators are used on the signal lines. If the termination of a signal line is poor or the terminator is missing, a severe distortion of the incident signal may occur such as that illustrated in FIG. 1B.

One application where a reflected signal may cause spurious events is on a Small Computer System Interface (SCSI) bus. A target device 110, (FIG. 1C) such as, a disk drive, a CD-ROM drive, a printer or a processor, is connected by a SCSI bus 120 to a host computer 130 that includes a host adapter circuit 131 which implements the SCSI protocol. The SCSI protocol is an industry standard interface specification defined in X3.131-1986 available from American National Standards Institute, 1430 Broadway, New York, N.Y. 10018. Document X3.131-1986 is incorporated herein in its entirety.

A SCSI bus has two sets of signal lines. A first set of signal lines is used to transfer control signals between target device 110 and host adapter circuit 131. A second set of signal lines is used to transfer data between target device 110 and host adapter circuit 131. If the termination on any one of the control signal lines is defective or even missing, signal waveforms such as those shown in FIGS. 1A and 1B may occur. The false edges created by the reflected signals may appear as true edges to host adapter circuit 131. In this case, the SCSI bus protocol is corrupted by the false edges. Typically, various methods have been used to provide an effective termination on the control signal lines. Nevertheless, reflected signals on the SCSI bus remain a problem.

SUMMARY OF THE INVENTION

In accordance with this invention, a time domain signal filter generates a distortion free output signal to replace an input signal that may contain signal distortion. The time domain signal filter is triggered by a predetermined change in the input signal, e.g. a transition such as a rising edge, and responds to the input signal change by generating the distortion free output signal, e.g., a rising edge transition to a high signal, for a predetermined time period, sometimes called a filter period.

After passage of the filter period, the time domain signal filter passes the input signal as the output signal (until the time domain signal filter is triggered again). Thus, the time domain signal filter replaces the input signal, a first signal, with a distortion free output signal, a second signal, for a predetermined time period and then replaces the second signal with the first signal. In this manner, the time domain signal filter shields a receiver circuit from fluctuations in the input signal during the filter period, thus eliminating false triggering of the receiver circuit.

In one embodiment, the time domain signal filter includes a signal replacement circuit and a signal switching circuit. The signal replacement circuit has an input line, a first output terminal and a second output terminal, i.e., an input line and a plurality of output terminals. In response to a signal transition on the input line, the signal replacement circuit drives a signal on the first output terminal connected to a selection signal input line of the signal switching circuit inactive and a signal on the second output terminal connected to a substitute signal input line of the signal switching circuit active for the duration of the filter period. The signal on the substitute signal input line is the distortion free signal that replaces the input signal.

The signal switching circuit has a signal input line and a signal output terminal in addition to the selection signal input line and the substitute signal input line, i.e., a plurality of input lines and an output terminal. The signal switching circuit acts as a multiplexer and connects the signal input line to the signal output terminal for as long as the signal on the selection signal input line is active. When the signal on the selection signal input line goes inactive, the signal switching circuit discontinues connecting the signal input line to the signal output terminal and instead connects the substitute signal input line to the signal output terminal. Thus, the signal switching circuit alternatively connects the signal input line and the substitute signal input line to the output terminal.

At the end of the filter period, the signal replacement circuit drives the signal on the selection signal input line active. When the signal on the selection signal input line goes active, the signal switching circuit resumes connecting the signal on the signal input line to the signal output terminal. In this manner, for the duration of a filter period, the time domain signal filter replaces the input signal with an internally generated distortion free signal.

The signal replacement circuit includes a trigger circuit and a signal generation circuit. The trigger circuit includes the signal replacement circuit input line, a reset input line, and first and second output terminals. The trigger circuit responds to the signal change on the signal replacement circuit input line by driving a trigger signal on the first output terminal active, e.g., high, and a complement of the trigger signal on the second output terminal inactive, e.g. low.

The signal generation circuit includes first and second input lines and the signal replacement circuit first and second output terminals. The trigger signal and the complement of the trigger signal drive the first and second input lines, respectively, of the signal generation circuit. When the complement of the trigger signal goes inactive, the signal generation circuit drives a substitute signal on the second output terminal that is connected to substitute signal input line active, e.g. high, and a deactivation signal on the first output terminal that is connected to selection signal input line inactive, e.g. low, for the duration of the filter period. On expiration of the filter period, the signal generation circuit drives the deactivation signal active. In response to the active deactivation signal, the signal switching circuit substitutes the signal on the signal input line for the substitute signal from the signal generation circuit.

Also, on expiration of the filter period, the signal generation circuit drives a reset signal on the trigger reset input line active. The active reset signal resets trigger circuit which drives the trigger signal and the complement of the trigger signal inactive and active respectively.

The trigger circuit is implemented, in one embodiment, by a flip-flop. Initially, when the input signal (an active low signal) is low, the flip-flop drives the complement of the trigger signal active which causes the signal generation circuit to drive the deactivation signal active and the substitute signal inactive so that the input signal passes through the delay circuit, the first and second logic gates as the output signal. A rising edge in the input signal clocks a power supply voltage at an input terminal of the flip-flop to an output terminal and so, drives the trigger signal active and the complement of the trigger signal inactive.

In this embodiment, the signal switching circuit includes a delay circuit and first and second logic gates. The input signal drives the delay circuit which in turn drives a first input line terminal of the first logic gate. A second input line terminal of the first logic gate is driven by the signal on the selection signal input line. The first logic gate masks the signal on the first input line terminal when the signal on the second input terminal is active and otherwise passes the signal on its first input line terminal therethrough. The output signal of the first logic gate drives a first input line terminal of the second logic gate. A second input line terminal of the second logic gate is driven by the signal on the substitute signal input line. The second logic gate generates the output signal of the time domain signal filter by passing the signals on the input terminals therethrough. The delay circuit inserts sufficient delay in the input signal so that deactivation signal goes inactive before the rising edge of the input signal reaches first logic gate.

A user can indicate the duration of the filter period by setting certain bits in a hardware register. The time domain signal filter determines the start of the filter period by using either the falling edge or the rising edge of a clock input signal, whichever edge comes first after the occurrence of the signal change in the input signal.

DETAILED DESCRIPTION

According to the principles of this invention, a time domain signal filter is utilized by a communication device to filter irregularities in an external signal received from a remote device. The time domain signal filter responds to a transition in the external signal by supplying a corresponding internally generated signal for the duration of a filter period. After passage of the filter period, the time domain signal filter passes the external signal therethrough. Therefore, the time domain signal filter shields a receiving circuit from fluctuations in the external signal during the filter period and thus eliminates the possibility of false triggering of the receiving circuit. In one embodiment the user can turn the time domain signal filter on and off as well as select the filter period (through bits in a hardware register), which provides flexibility for different applications.

Figure 2A:
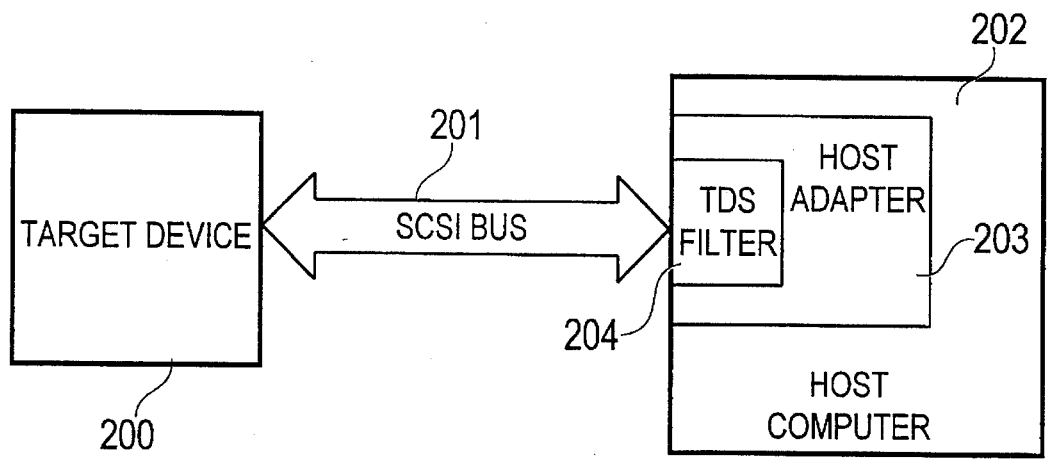
FIG. 2A shows a high-level block diagram of one embodiment of a time domain signal filter being used in a computer in accordance with this invention.

FIG. 2A shows a host adapter 203 of a host computer 202 which communicates with a target device 200 on SCSI bus 201. In accordance with this invention, host adapter 203 has a time domain signal filter 204 which filters irregularities in a signal received by host adapter 203 on SCSI bus 201.

Figure 1A:
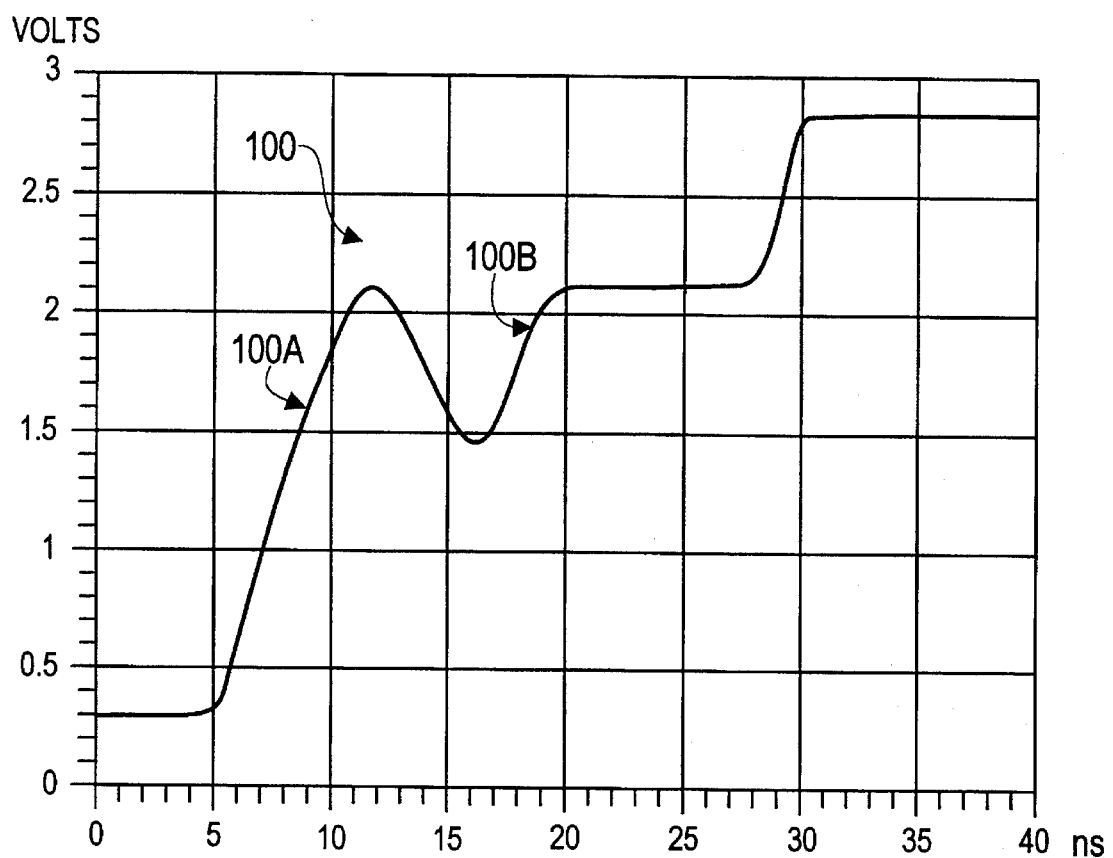
FIG. 1A shows a waveform in a signal line having distortions due to reflections.
Figure 1B:
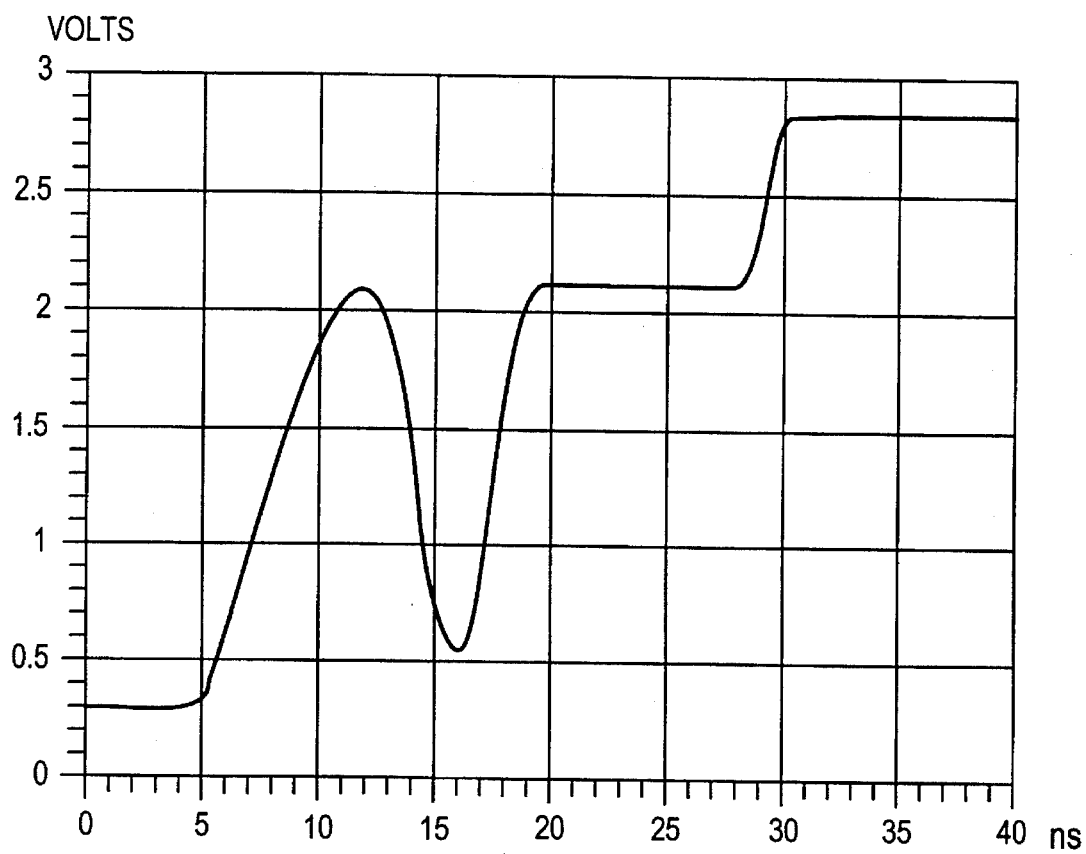
FIG. 1B shows a waveform in a signal line with exaggerated distortions.
Figure 1C:
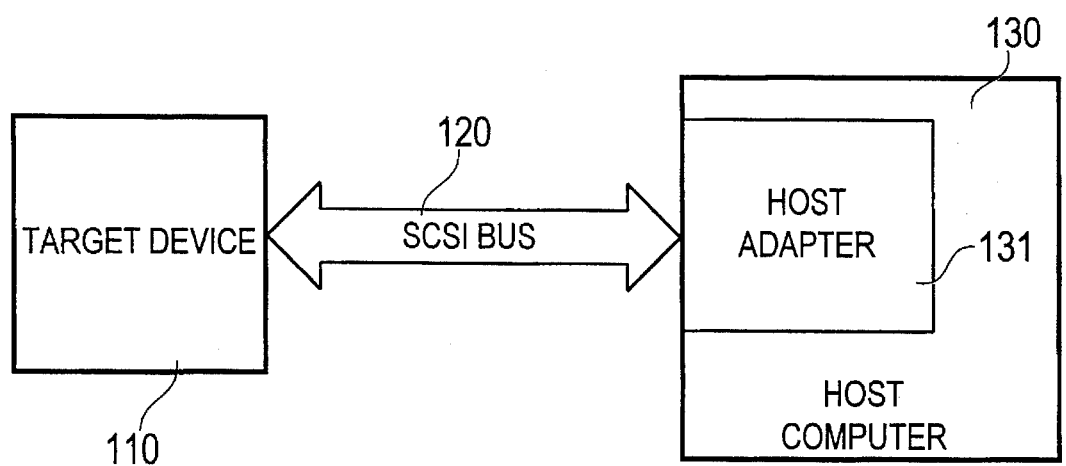
FIG. 1C shows a high-level block diagram of a target device communicating with a computer.
Figure 2B:
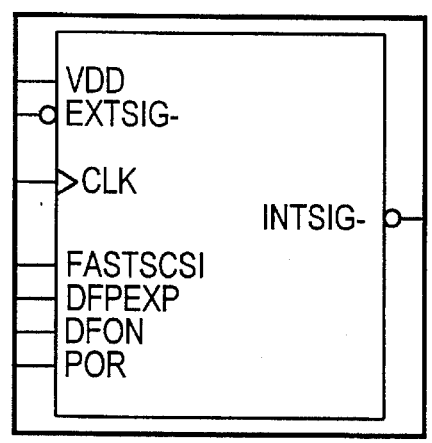
FIG. 2B shows a signal interface for one embodiment of the time domain signal filter of FIG. 2A.

FIG. 2B shows a signal interface for one embodiment of a time domain signal filter 204 of this invention. In this embodiment, time domain signal filter 204 has seven input signals and one output signal. External input signal EXTSIG- hereinafter signal EXTSIG-, is one of the signals received from SCSI bus 201 (such as any one of signals REQ, BSY, SEL, MSG and ACK) and may have irregularities such as those shown in FIGS. 1A and 1B. Time domain signal filter 204 filters irregularities in signal EXTSIG- and generates an internal output signal INTSIG-, hereinafter signal INTSIG-.

When time domain signal filter 204, sometimes called filter 204, detects a transition in signal EXTSIG-, filter 204 supplies an internally generated substitute signal as signal INTSIG- for the duration of a predetermined period, also referred to herein as a filter period. After passage of the requisite filter period, time domain signal filter 204 passes signal EXTSIG- directly therethrough as signal INTSIG-. Thus, time domain signal filter 204 shields host adapter 203 (FIG. 2A) from fluctuations in signal EXTSIG- during the predetermined period, which eliminates false triggering of host adapter 203.

The predetermined period of time domain signal filter 204 is determined from two time delay control input signals, FASTSCSI and DFPEXP. Input signal FASTSCSI indicates if the data transmission speed is at the Fast SCSI rate of greater than 5 MBytes/sec, in which case a first predetermined period is selected by time domain signal filter 204 independent of the signal level of control input signal DFPEXP. When input signal DFPEXP is active and input signal FASTSCSI is inactive, time domain signal filter 204 uses a second predetermined period, which in this embodiment is the maximum time delay of filter 204.

Filtering by time domain signal filter 204 is turned on or off by the state, i.e., level of input signal DFON, hereinafter simply signal DFON. If signal DFON is inactive, filtering is turned off and time domain signal filter 204 passes signal EXTSIG- directly therethrough as signal INTSIG-, without any filtering.

Time domain signal filter 204 is clocked by clock input signal CLK, which in this embodiment is a square wave clock signal. Input signal VDD to time domain signal filter 204 is the power supply voltage. During initial power-up, an input signal POR goes active to indicate power-on reset which causes components of time domain signal filter 204 to be reset.

Figure 2C:
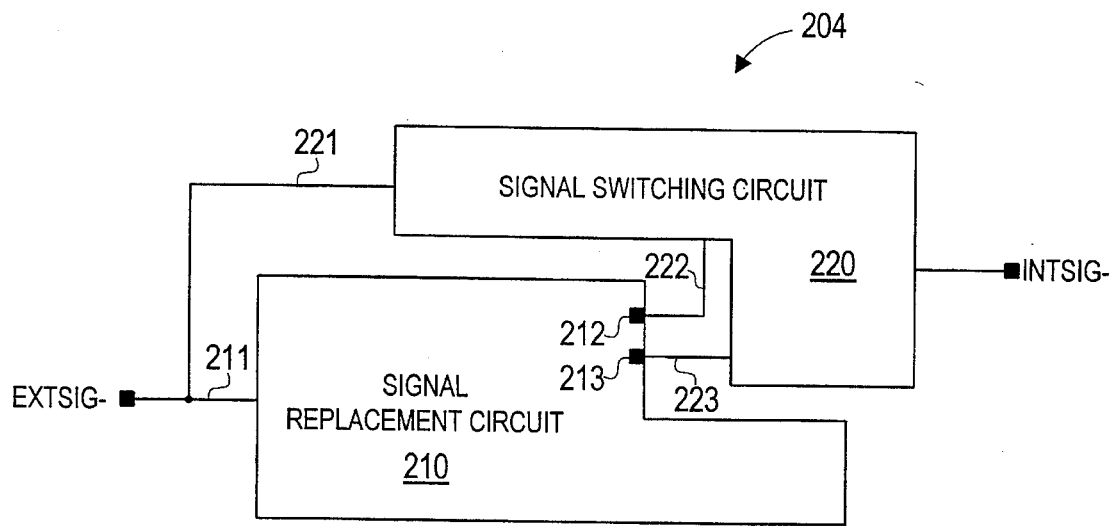
FIG. 2C shows a high-level block diagram of one embodiment of the time domain signal filter of FIG. 2A.

FIG. 2C shows a high-level block diagram of one embodiment of time domain signal filter 204. Time domain signal filter 204 includes a signal replacement circuit 210 and a signal switching circuit 220. Most of the signals discussed above in reference to FIG. 2B are not shown in FIG. 2C for clarity.

Signal EXTSIG- from a communication bus drives an input line 211 of signal replacement circuit 210. In response to a transition in signal EXTSIG-, signal replacement circuit 210 generates inactive and active signals on first and second output terminals 212 and 213 for the duration of a predetermined period. The active signal on second output terminal 213 is an internally generated distortion free signal intended to replace signal EXTSIG-. The inactive signal on first output terminal 212 indicates that replacement of signal EXTSIG- is to take place. At the end of the predetermined period, signal replacement circuit 210 drives the signals on first and second output terminals 212 and 213 active and inactive.

Signal EXTSIG- also drives signal input line 221 of signal switching circuit 220. A selection signal input line 222 and a substitute signal input line 223 of signal switching circuit 220 are connected to output terminals 212 and 213, respectively. Signal switching circuit 220 passes signal EXTSIG- directly as signal INTSIG- for as long as the signal on selection signal input line 222 is active. When the signal on selection signal input line 222 goes inactive, signal switching circuit 230 discontinues passing signal EXTSIG- as signal INTSIG- and instead passes the signal on substitute signal input line 223 as signal INTSIG-. When the signal on selection signal input line 222 goes active (at the end of the filter period), signal switching circuit 230 resumes passing signal EXTSIG- directly as signal INTSIG-.

In this manner, for the duration of a predetermined period, signal EXTSIG- is replaced by an internally generated distortion free signal by time domain signal filter 204. A receiving circuit driven by signal INTSIG- normally receives signal EXTSIG- but is shielded from fluctuations in signal EXTSIG- during the filter period. Therefore, time domain signal filter 204 eliminates false triggering of host adapter 203 (FIG. 2A) that could normally be caused by fluctuations in signal EXTSIG- during the filter period.

Figure 2D:
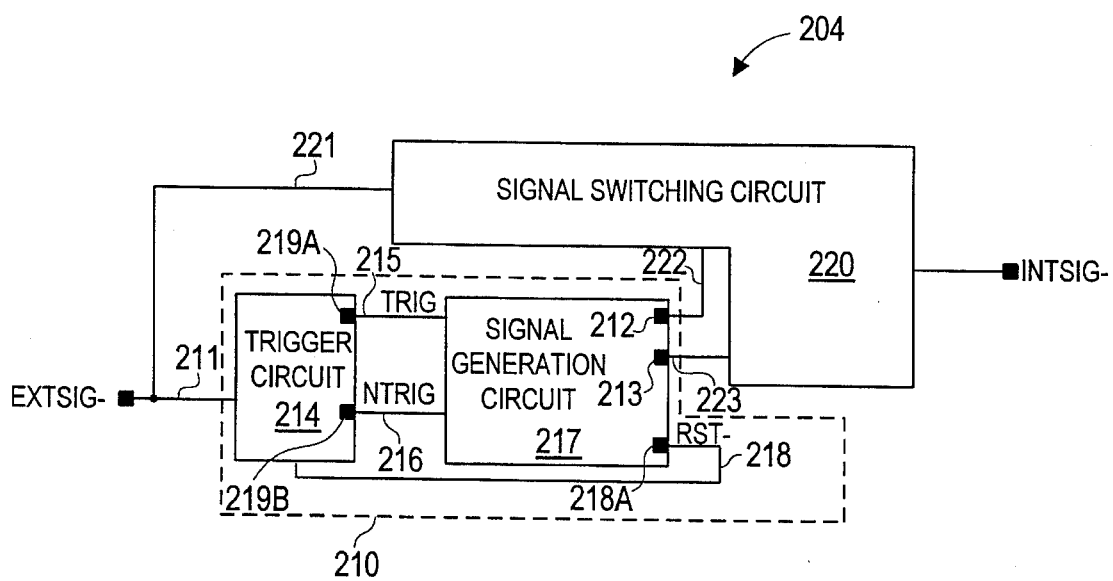
FIG. 2D shows a low-level block diagram of one embodiment of the time domain signal filter of FIG. 2A.

FIG. 2D shows a more detailed block diagram of the time domain signal filter 204 of FIG. 2C showing details of signal replacement circuit 210. Signal replacement circuit 210 includes a trigger circuit 214 and a signal generation circuit 217.

Trigger circuit 214 includes input line 211 of signal replacement circuit 210 which is driven by signal EXTSIG-. In response to a predetermined signal change e.g. a signal transition, on input line 211, trigger circuit 214 drives signal TRIG on first output terminal 219A active, e.g., high, and also drives signal NTRIG on second output terminal 219B inactive, e.g., low. In a first embodiment, trigger circuit 214 is responsive to a falling edge on input line 211; in a second embodiment, trigger circuit 214 is responsive to a rising edge on input line 211; and in a third embodiment, trigger circuit 214 is responsive to both a rising edge and a falling edge on input line 211.

Signal generation circuit 217 has a first input line 215 connected to first output terminal 219A and carrying signal TRIG. Signal generation circuit 217 also has a second input line 216 connected to second output terminal 219B and carrying signal NTRIG.

When signal NTRIG on input line 216 is active, e.g. high, signal generation circuit 217 drives a signal on output terminal 213 connected to substitute signal input line 223 of signal switching circuit 220 inactive, e.g., low. Simultaneously, signal generation circuit 217 also drives a signal on output terminal 212 connected to selection signal input line 222 of signal switching circuit 220 active, e.g., high.

When signal NTRIG on input line 216 goes inactive, e.g., low, signal generation circuit 217 drives a signal on output terminal 213 active, e.g., high, for the duration of the filter period. Simultaneously, signal generation circuit 217 also drives a signal on output terminal 212 inactive, e.g., low, for the duration of the filter period.

On expiration of the filter period, signal generation circuit 217 drives the signals on terminals 212 and 213 active and inactive, respectively. Also, on expiration of the filter period, signal generation circuit 220 drives a reset signal RST- on terminal 218A connected to a reset input line 218 of trigger circuit 214 active, e.g., low. Active signal RST- resets trigger circuit 214. On being reset, trigger circuit 214 drives signals TRIG and NTRIG on first and second output terminals 219A and 219B inactive and active, respectively.

Figure 3:
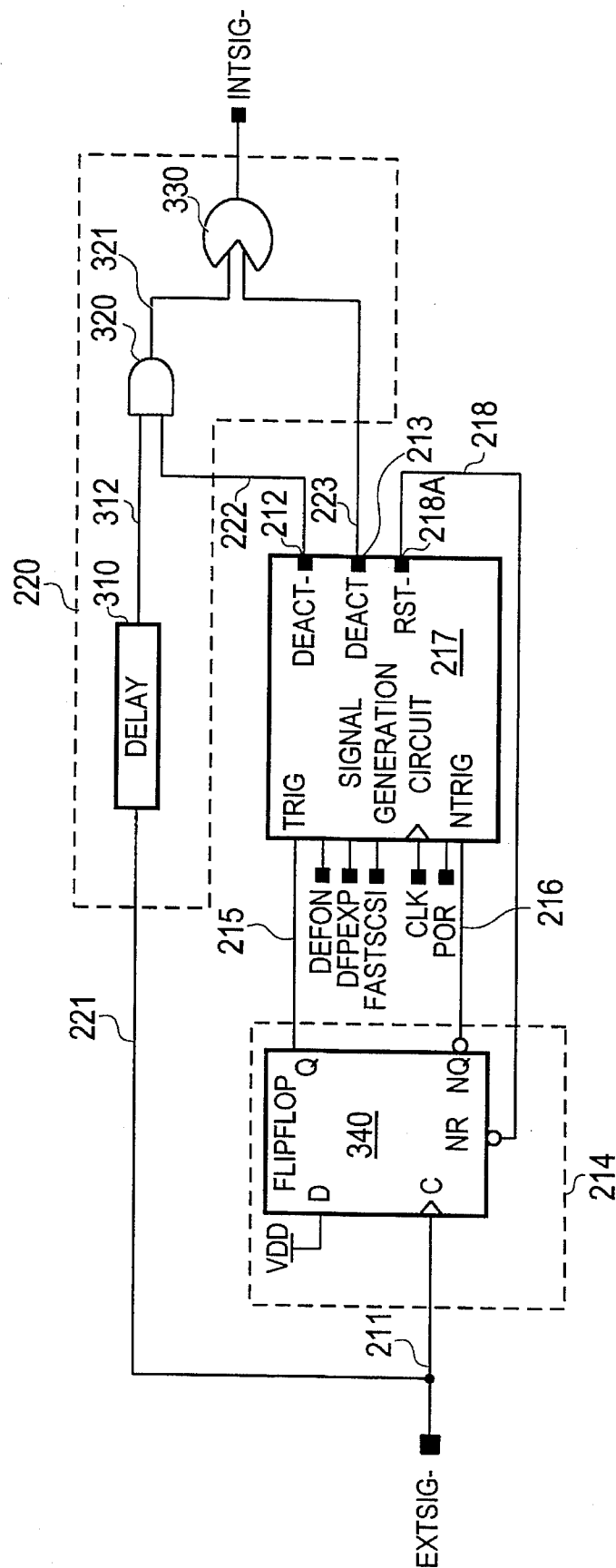
FIG. 3 is an illustrative circuit diagram of one embodiment of the time domain signal filter of FIG. 2B.

FIG. 3 is an illustrative circuit diagram of one embodiment of time domain signal filter 204 showing one implementation of trigger circuit 214 and signal switching circuit 220 of FIG. 2B. Trigger circuit 214 is implemented by a D-type flip-flop 340. Signal switching circuit 220 includes a delay circuit 310, an AND gate 320 and an OR gate 330, i.e., a delay circuit with first and second logic gates.

Signal EXTSIG- on input line 221 of signal switching circuit 220 drives delay circuit 310 which in turn drives a first input line 312 of AND gate 320. Selection signal input line 222 is a second input line to AND gate 320. OR gate 330 is driven by the signal on substitute signal input line 223 and by the signal on input line 321, which is the output signal of AND gate 320. The output signal of OR gate 330 drives output terminal INTSIG- of filter 204. Herein, for convenience the same reference numeral INTSIG- is used for the output terminal and the output signal of filter 204 on that terminal.

Initially, when signal EXTSIG- (an active low signal) is low, flip-flop 340 drives signal NTRIG on input line 216 high which causes signal generation circuit 217 to drive signal DEACT- on terminal 212 high and signal DEACT on terminal 213 low so that signal EXTSIG- passes through delay circuit 310, AND gate 320, and OR gate 330 to output terminal INTSIG-.

Passage of signal EXTSIG- through filter 204 to output terminal INTSIG- is disabled when flip-flop 340 detects a transition in signal EXTSIG-. In the embodiment of FIG. 3, a rising edge on input line 211 clocks the power supply voltage on input terminal D of flip-flop 340 to output terminal Q and so, drives signal TRIG high and signal NTRIG low.

When signal NTRIG goes low, signal generation circuit 217 drives signal DEACT on terminal 213 high and signal DEACT- on terminal 212 low. When signal DEACT- goes low, AND gate 320 masks the signal on line 312 which discontinues the direct output of signal EXTSIG- by OR gate 330. Delay circuit 310 in signal switching circuit 220 ensures that signal DEACT- on switch signal input line 222 goes low before the rising edge of signal EXTSIG- reaches AND gate 320. Therefore, delay circuit 310 and AND gate 320 prevent the rising edge in signal EXTSIG- from appearing in signal INTSIG-. The time delay in delay circuit 310 corresponds to at least the sum of the time delay of flip-flop 340 and the time delay in signal generation circuit 217.

When signal DEACT- goes low, signal DEACT simultaneously, goes active on input line 223 and is passed by OR gate 330 so that signal INTSIG- goes inactive, e.g. high. Thus, the initial action of input signal EXTSIG-, i.e., the deactivation, is created on output terminal INTSIG- by a signal generated by filter 204. Note that if a reflection in signal EXTSIG- should clock flip-flop 340, the input signals to signal generation circuit 217 are unchanged.

Signal generation circuit 217 starts counting the passage of the filter period from the first occurrence of an edge, either a rising edge or a falling edge, in signal CLK after flip-flop 340 drives signal TRIG active, e.g. high. After passage of the filter period, signal generation circuit 217 drives signal RST- (an active low signal) low on terminal 218A.

A low signal RST- on reset input line 218 resets flip flop 340. On being reset, flip flop 340 drives signal TRIG on input line 215 low and signal NTRIG on input line 216 high. When signal TRIG goes low, signal generation circuit 217 drives signal DEACT- on switch signal input line 222 high and drives signal DEACT on substitute signal input line 223 low. When signal DEACT- goes high, AND gate 320 passes the output signal from delay circuit 310, i.e., signal EXTSIG- to OR gate 330. OR gate 330 passes signal EXTSIG- on line 321 as signal INTSIG- until the next rising edge on line 211.

Figure 4:
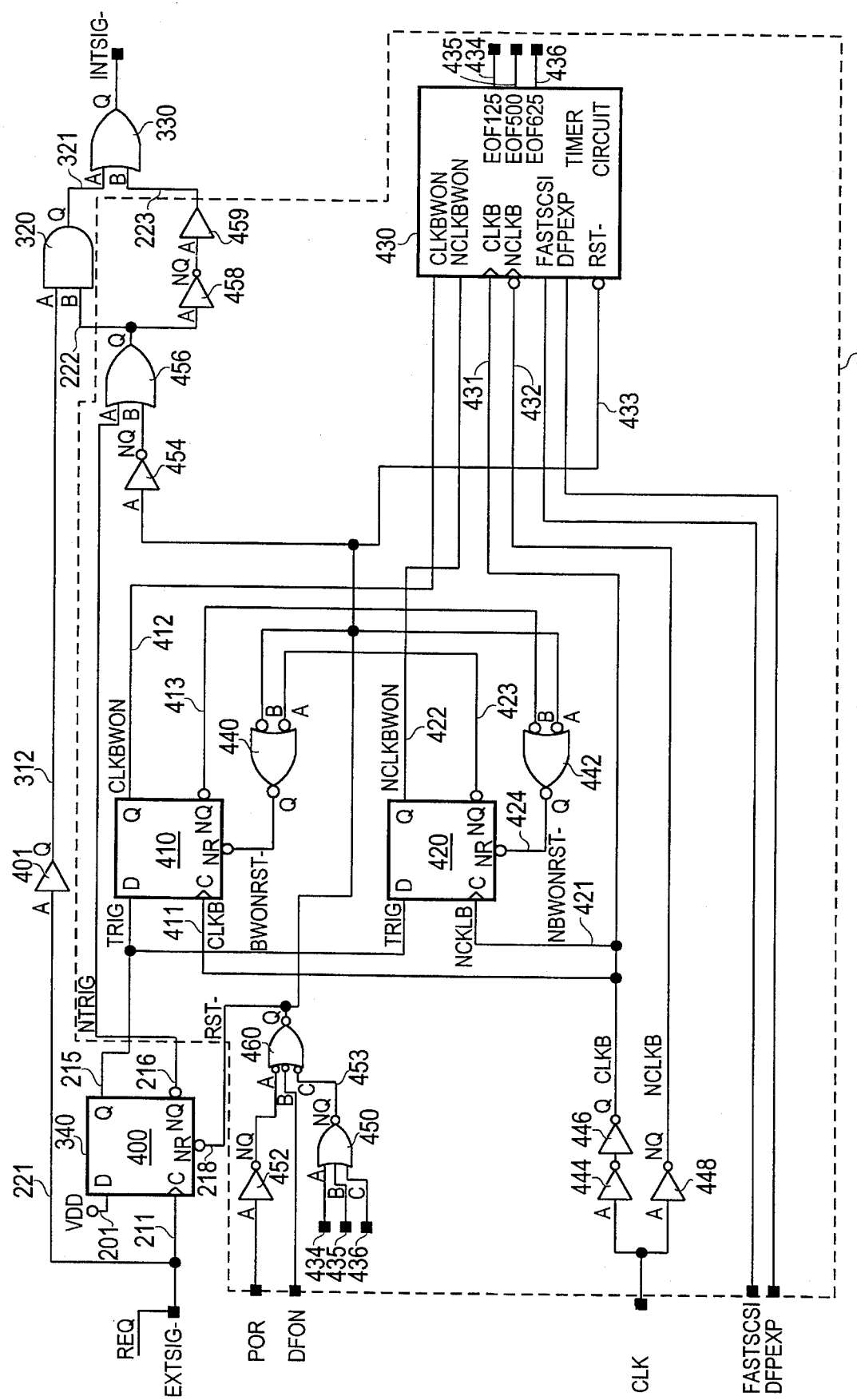
FIG. 4 is an illustrative circuit diagram of one embodiment of the time domain signal filter showing details of the signal generation circuit of FIG. 3.

FIG. 4 is an illustrative circuit diagram of one embodiment of time domain signal filter 204 showing details of signal generation circuit 217 of FIG. 3. Signal generation circuit 217 includes two D-type flip-flops 410 and 420 and a timer circuit 430 (shown in detail in FIG. 5A) in addition to logic gates and buffers.

Signal TRIG on input line 215 drives D input terminals of flip-flops 410 and 420. Flip-flops 410 and 420 synchronize signal TRIG on input line 215 with either a falling edge or a rising edge of signal CLK. Flip-flop 410 is clocked by a signal CLKB on line 411. Signal CLKB is obtained by buffering signal CLK in buffers 444 and 446. Flip-flop 420 is clocked by signal NCLKB on line 421. Signal NCLKB is obtained by inverting signal CLK in inverter 448. When signal TRIG goes high, depending on whichever edge, the rising edge or the falling edge of signal CLK occurs first, one of the two flip-flops 410 and 420 is clocked first.

Figure 7:
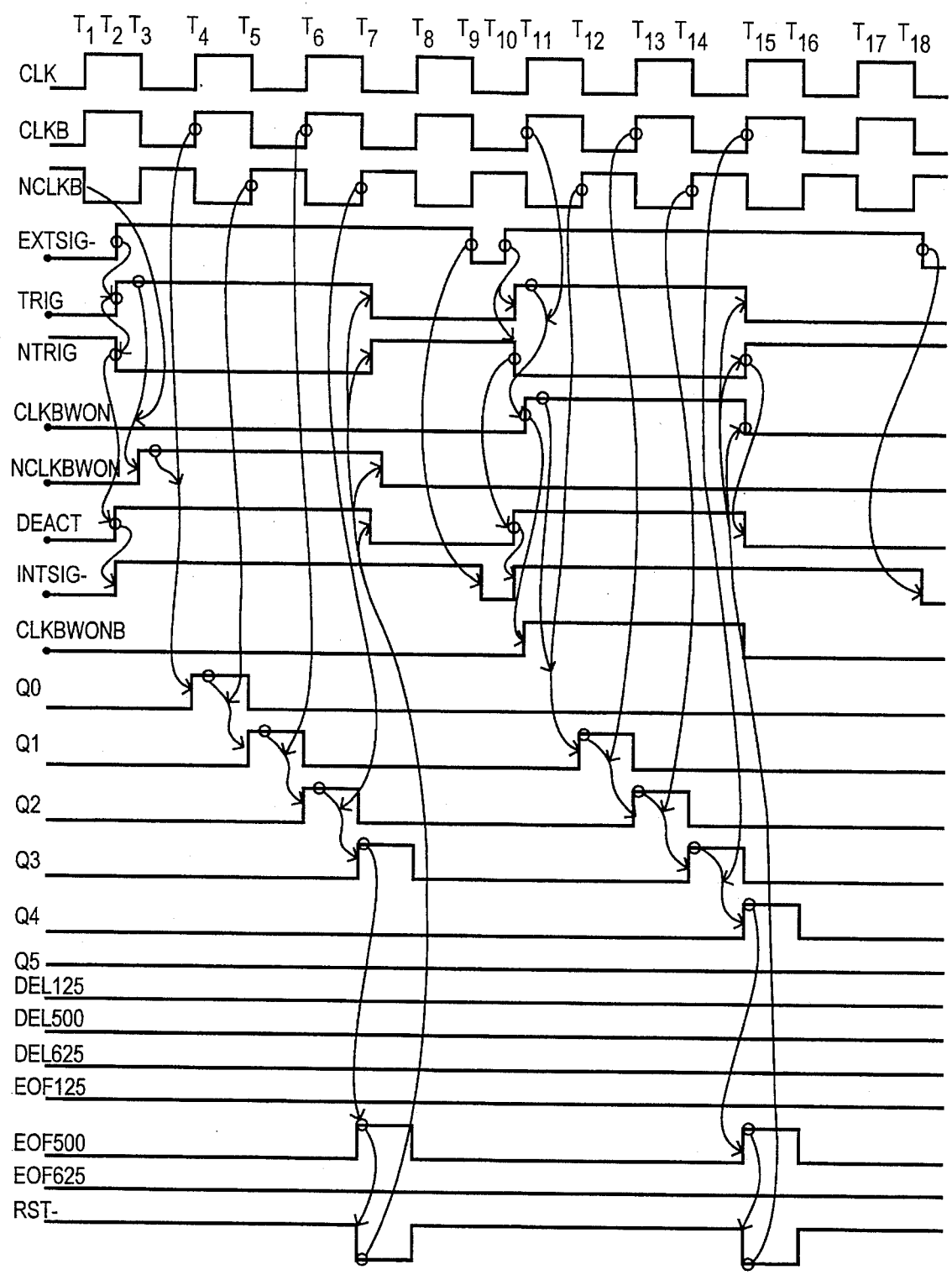
FIG. 7 is an illustrative conceptual timing diagram for various signals in one embodiment of a time domain signal filter in accordance with this invention.

In an example shown in FIG. 7, after a rising edge in signal CLK at time t1, signal EXTSIG- rises at time t2. The transition in signal EXTSIG- at time t2 is detected by flip-flop 340 (FIG. 4) which drives signal TRIG high and signal NTRIG low. The first edge in signal CLK after signal TRIG goes high is a falling edge at time t3 (FIG. 7). Therefore a corresponding rising edge in signal NCLKB clocks flip-flop 420 (FIG. 4) first and flip-flop 420 drives signal NCLKBWON on input line 422 of timer circuit 430 high and signal on line 423 to a first input terminal of AND gate 440 low (FIG. 7). Buffer and gate delays are not shown in FIG. 7.

Alternatively, in another example shown in FIG. 7, signal EXTSIG- rises at time t10, which happens immediately after a falling edge in signal CLK. Therefore, in this case, signal TRIG goes high and signal NTRIG goes low at time t10. At time t11, a rising edge in signal CLKB clocks flip-flop 410 (FIG. 4) and flip-flop 410 drives signal CLKBWON on input line 412 of timer circuit 430 high and a signal on line 413 connected to a first input terminal of AND gate 442 low (FIG. 7).

A second input terminal of AND gate 440 is connected to signal RST- by line 433 from AND gate 460. The output terminal of AND gate 440 is connected to reset line 414 of flip-flop 410. When flip-flop 420 is clocked, the signal on line 423 goes low and so AND gate 440 drives the signal on line 414 low which in turn holds flip-flop 410 in reset.

Similarly a second input terminal of AND gate 442 is connected to signal RST- by line 433 from AND gate 460. The output terminal of AND gate 442 is connected to reset line 424 of flip-flop 420. When flip-flop 410 is clocked, the signal on lines 413 goes low and so AND gate 442 drives the signal on line 424 low which in turn holds flip-flop 420 in reset.

Therefore, once one of the two flip-flops 410 and 420 is clocked, the other flip-flop is held in reset and so is not clocked. In the example shown in FIG. 7, at time t3, signal NCLKBWON goes high and signal CLKBWON stays low because flip-flop 420 turns on and resets flip-flop 410, and the reverse is true at time t11. Therefore at any given time, in response to signal TRIG going active, only one of the two signals CLKBWON and NCLKBWON goes high while the other signal stays low.

Referring back to FIG. 4, signals CLKBWON and NCLKBWON on lines 412 and 422 are inputs to timer circuit 430. Timer circuit 430 determines a filter period based upon the state of signal FASTSCSI and signal DFPEXP, as explained more completely below. After passage of the filter period, timer circuit 430 drives one of signals EOF125, EOF500 and EOF625 on one of terminals 434, 435 and 436 active, e.g. high in the embodiment of NOR gate 450. The moment a signal on one of terminals 434, 435 or 436 goes high, NOR gate 450 drives the signal on line 453 low which causes AND gate 460 to drive signal RST- on line 218 low. When signal RST- on line 218 goes low, flip-flop 340, flip-flop 410, flip-flop 420 and timer circuit 430 are reset.

Signal RST- on line 218 is also driven low by AND gate 460 when either signal DFON is low or signal POR is high. High signal POR is inverted by inverter 452, which drives an input terminal of AND gate 460. Therefore, when signal DFON is low, signal RST- is active and so flip-flop 340 is held in reset. Therefore either high signal POR or low signal DFON effectively disables filter 204. In one embodiment, signal DFON is driven by a user accessible bit stored in a hardware register.

Now considering the circuit operation in more detail, initially, when signal EXTSIG- on line 211 is active, signal NTRIG, on line 216 to first input terminal of OR gate 456 drives the output signal of OR gate 456 on select signal input line 222 to AND gate 320 high. The output signal of OR gate 456 is signal DEACT-. High signal DEACT- from OR gate 456 drives the output signal of inverter 458 low which in turn drives the output signal of buffer 459 low. The output signal of buffer 459 is signal DEACT.

As explained above, the rising edge of signal EXTSIG- on line 211 drives signal NTRIG on input line 216 to OR gate 456 low (see FIG. 4). Also, signal RST- on line 433 drives the output signal of inverter 454 high so that the signal on a second input terminal of OR gate 456 goes low (see signals EXTSIG-, NTRIG and RST- at time t1 in FIG. 7). Hence, when signal NTRIG goes low (and the signal to OR gate 456 from inverter 454 stays low), OR gate 456 drives signal DEACT- on line 222 low and consequently inverter 458 and buffer 459 drive signal DEACT on line 223 high. The response of AND gate 320 and OR gate 330 to signals DEACT- and DEACT was described above.

The change of state in signals DEACT and DEACT- explained above was in response to a rising edge of signal EXTSIG-. Signals DEACT and DEACT- also change state at the end of the filter period. The passage of the filter period is signalled by timer circuit 430.

Figure 5A:
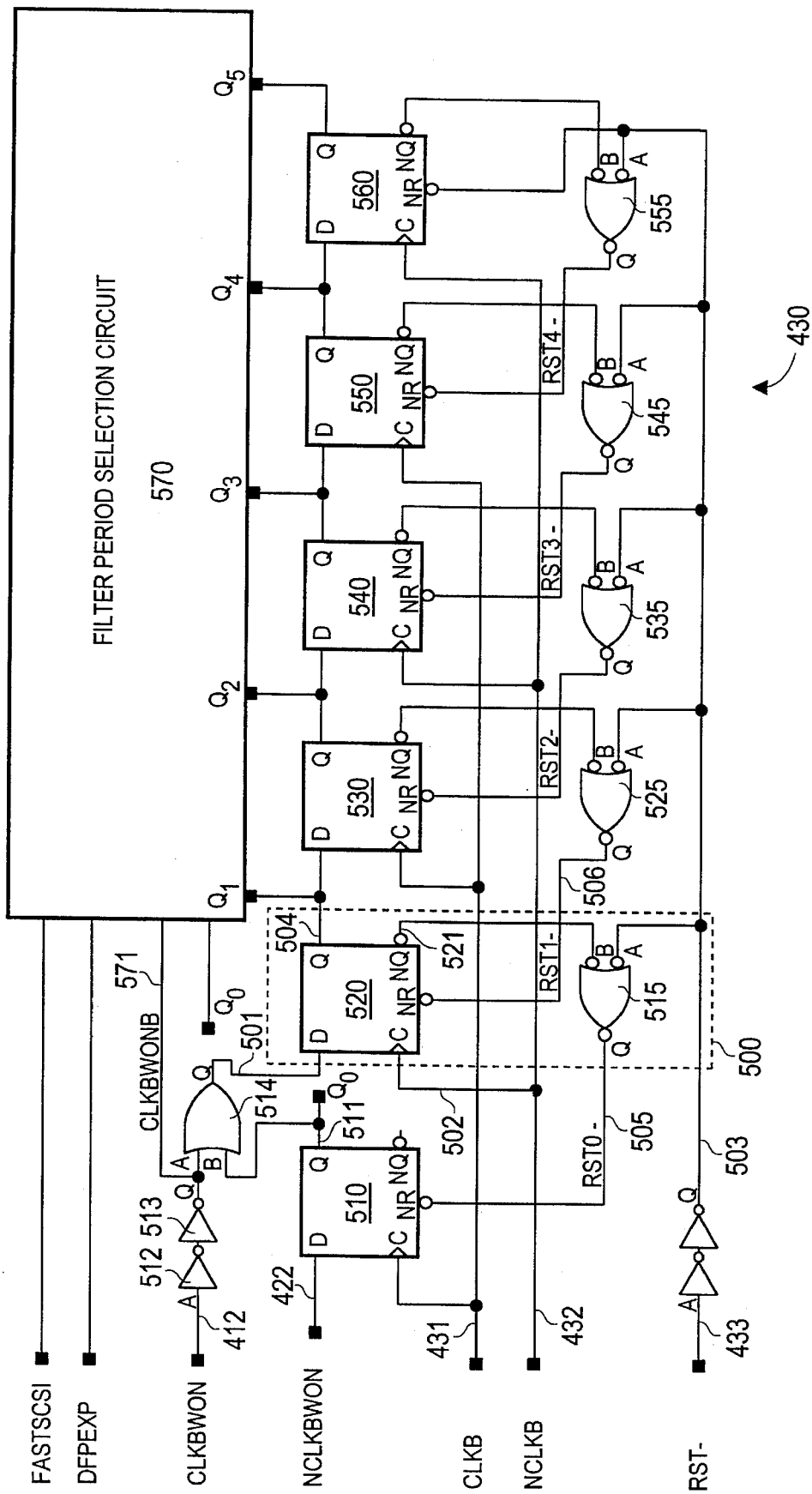
FIG. 5A is an illustrative circuit diagram of one embodiment of the timer circuit of FIG. 4.

FIG. 5A is an illustrative circuit diagram of one embodiment of timer circuit 430 of FIG. 4. Timer circuit 430 includes six flip-flops 510, 520, 530, 540, 550 and 560 and associated AND gates. A flip-flop such as flip-flop 520 and an AND gate such as AND gate 515 are included in a timer stage 500. After signal NCLKBWON on line 422 goes high, flip-flop 510 drives signal Q0 on line 511 high at time t3 (FIG. 7) on a rising edge of signal CLKB on line 431 (see time t4 in FIG. 7).

Figure 5B:
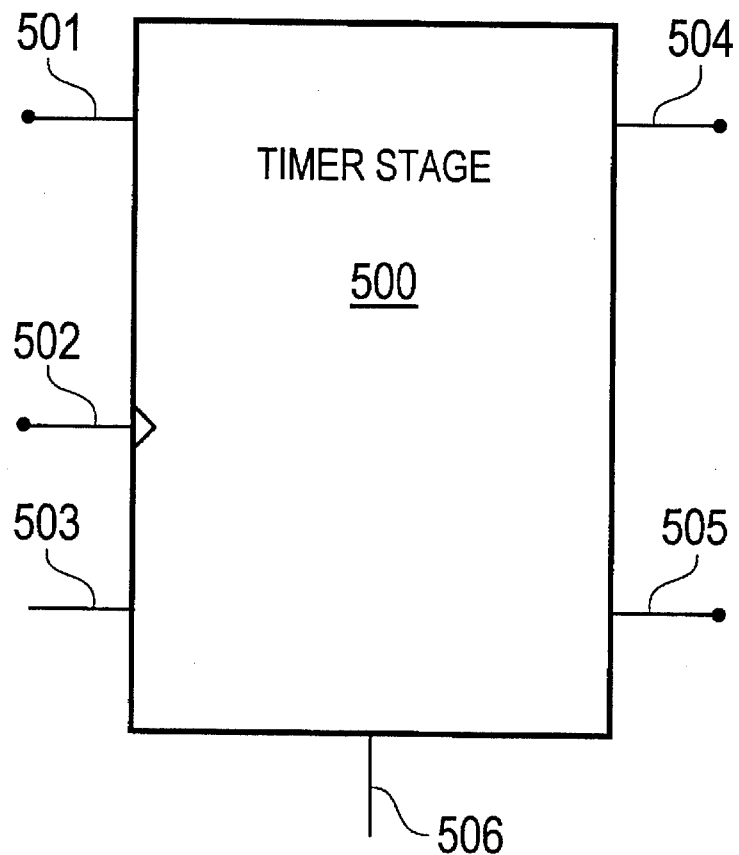
FIG. 5B is an illustrative block diagram of a timer stage used to implement the timer circuit of FIG. 4.

FIG. 5B is an illustrative block diagram of a timer stage 500 used to implement the timer circuit of FIG. 5A. A high signal on line 501 and an edge on line 502 (such as a rising edge or a falling edge) cause timer stage 500 to drive a signal on line 504 high and a signal on line 505 low. The signal on line 504 can drive a next timer stage while the signal on line 505 can reset a previous timer stage. Signals on lines 503 and 506 can reset timer stage 500. Thus timer circuit 430 (FIG. 5A) cascades several timer stages 500 (FIG. 5B) to determine the passage of a desired number of half clock cycles corresponding to various filter periods. Although successive alternate timer stages 500 in FIG. 5A are shown being clocked by a first clock signal CLKB and inverse of first clock signal NCLKB, any number of clock signals in any phase relative to each other can be used to clock the various timer stages to implement various desired filter periods (and granularity between available filter periods).

The time difference between a signal on line 422 going high and a signal on line 431 having a rising edge is half a clock cycle, because signal NCLKBWON goes high at the falling edge of signal CLK subsequent to a rising edge of signal EXTSIG-. Therefore, signal Q0 indicates a duration of half a clock cycle. If the rising edge in signal EXTSIG- occurs during the setup interval before a rising edge in signal CLK, the duration for signal Q0 to go high is more than half a clock cycle, but less than a full clock cycle.

Signal Q0 passes through OR gate 514 and drives input terminal D of flip-flop 520. The next rising edge of signal NCLKB on line 502 to terminal C of flip-flop 520 at time t5 (FIG. 7) clocks output signal Q0 through flip-flop 520 and so drives signal Q1 on line 504 high and the signal on line 521 low. The low signal on line 521 drives the output signal of AND gate 515 low which in turn resets flip-flop 510. Signal Q1 goes high half a clock cycle after signal Q0 goes high. Therefore, signal Q1 represents a filter period duration of one clock cycle.

If a rising edge in signal EXTSIG- is detected first by flip-flop 410, signal CLKBWON on line 412 goes high and signal NCLKBWON on line 422 remains low. In this case, signal Q1 represents a filter period duration of half a clock cycle instead of a full clock cycle.

To implement a half clock cycle filter period, filter period selection circuit 570 selects one of signals Q0 or Q1 depending on whether a rising edge or a falling edge occurred first in signal CLK after the rising edge in signal EXTSIG- as indicated by signal CLKBWONB on line 571. Signal CLKBWONB is obtained from signal CLKBWON on line 412 because line 571 is connected via inverters 512 and 513 to line 412. As seen in FIG. 7, a falling edge in signal CLK occurs first at t3 whereas a rising edge in signal CLK occurs first at t11. Therefore Q0 represents half a clock cycle at time t4 while Q1 represents half a clock cycle at time t12.

Based on timer stage circuitry similar to that described above for signals Q0 and Q1, signals Q2, Q3, Q4 and Q5 represent successive half clock cycle periods after a signal is driven high by the previous timer stage.

After signal Q1 goes high, flip-flop 530 drives signal Q2 high on the next rising edge in signal CLKB (see time t6 in FIG. 7). High signal Q2 is clocked by flip-flop 540 as high signal Q3 on the next rising edge in signal NCLKB, i.e. on the rising edge at time t7 of signal NCLKB.

Filter period selection circuit 570 selects one of signals Q3, Q4 to implement a two clock cycle filter period and one of signals Q4, Q5 to implement a two-and-half clock cycle filter period depending on signal CLKBWONB. Filter period selection circuit 570 determines the user selected duration of the filter period from signal FASTSCSI and signal DFPEXP.

Figure 6A:
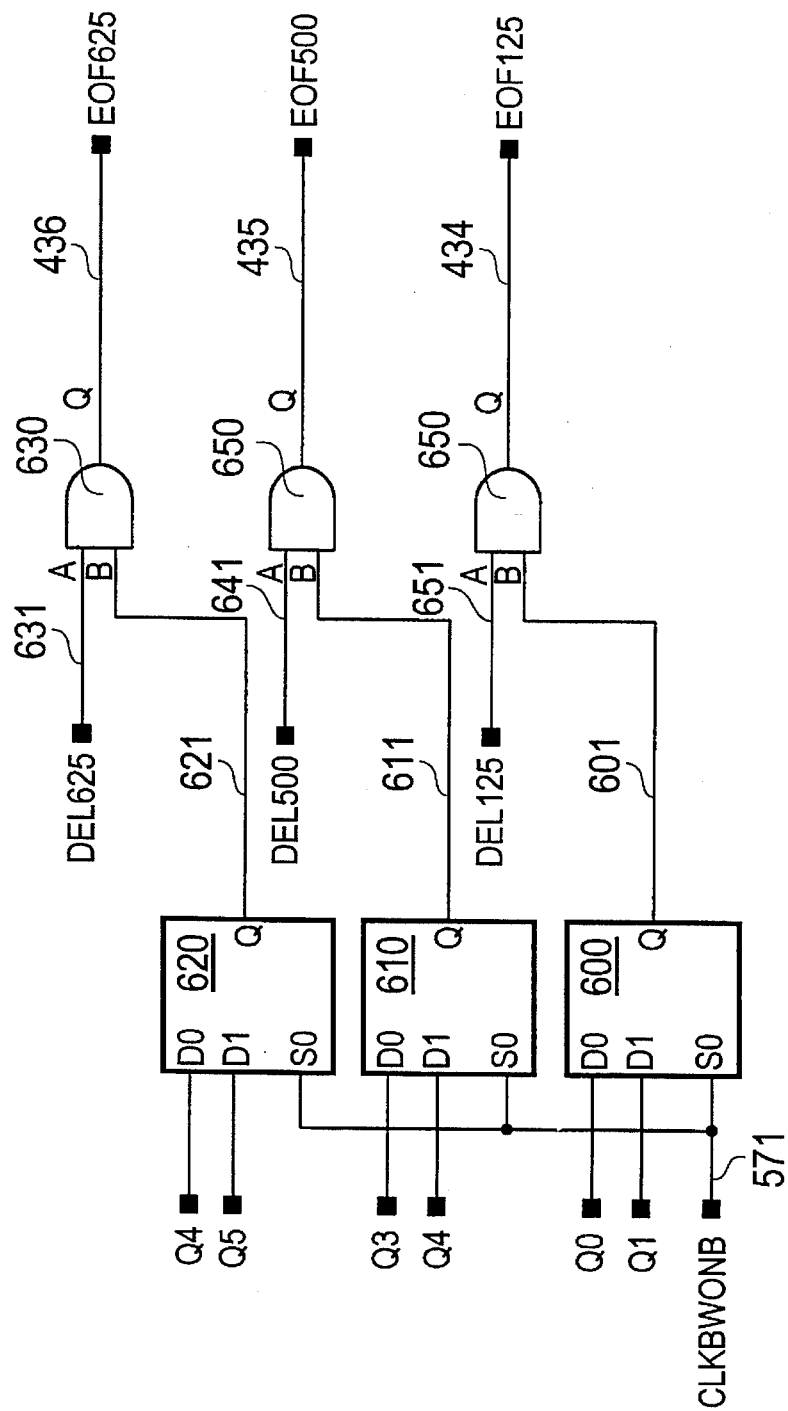
FIGS. 6A and 6B illustrate one embodiment of the filter period selection circuit of FIG. 5B.
Figure 6B:
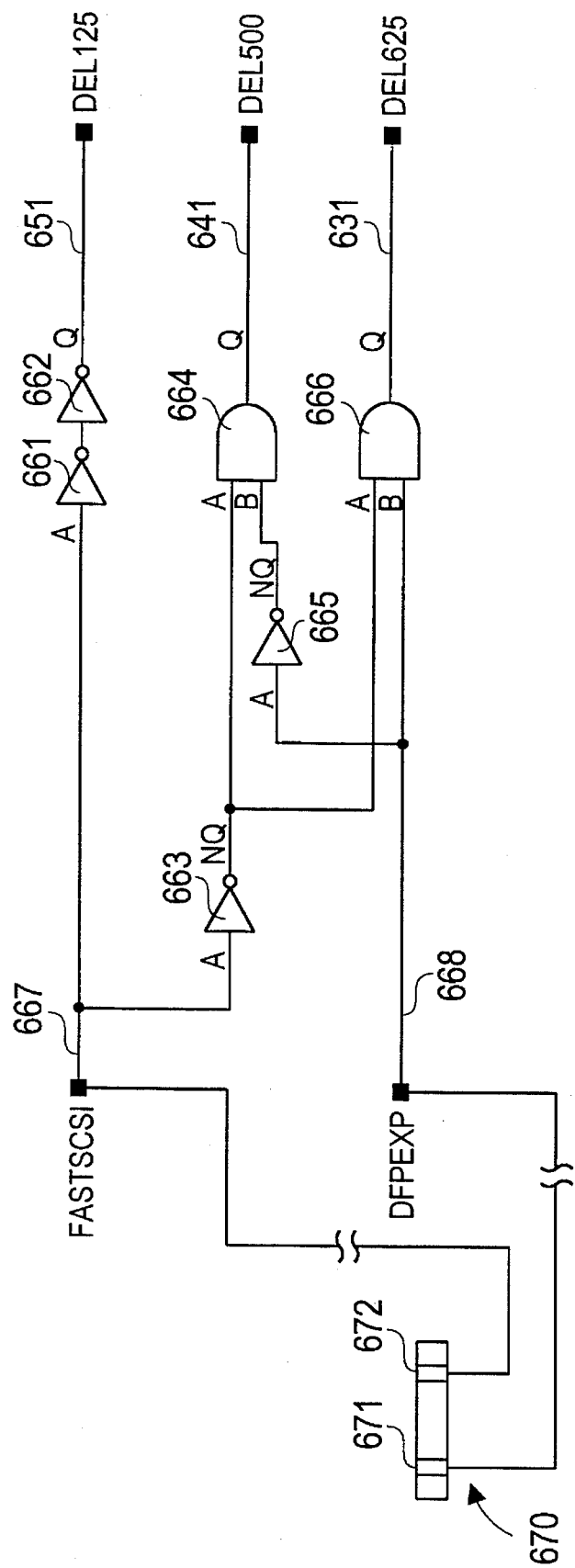

FIGS. 6A and 6B illustrate one embodiment of filter period selection circuit 570 of FIG. 5A. A multiplexer 600 passes signal Q0 to line 601, when signal CLKBWONB on line 571 is low and alternatively passes signal Q1 to line 601 when signal CKLBWONB on line 571 is high. Therefore the signal on line 601 represents a filter period of half a clock cycle.

Similarly, multiplexer 610 passes a signal to line 611 representing a filter period of two clock cycles and MUX 620 passes a signal to line 621 representing a filter period of two and a half cycles. A signal from one of lines 601, 611, and 621 is passed by AND gates 650, 640 and 630 on to lines 434, 435 and 436 depending on which one of signals DEL125, DEL500 and DEL625 on lines 651, 641 and 631 is high.

As shown in FIG. 6B, only one of signals DEL125, DEL500 and DEL625 on lines 651, 641 and 631 is driven high and the other two signals are driven low based on the state of signal FASTSCSI on fastscsi input line 667 and signal DFPEXP on filter period expansion line 668.

Signal FASTSCSI drives buffers 661 and 662 and is passed as signal DEL125 on line 651. Signal FASTSCSI also drives inverter 663 which in turn drives a first input terminal of AND gate 664 and a first input terminal of AND gate 666. AND gates 664 and 666 drive signals DEL500 and DEL625 on lines 641 and 631 respectively. When signal FASTSCSI is high, the output signal of inverter 663 drives the output signal of AND gates 664 and 666 low. Thus, when signal FASTSCSI is active, signals DEL625 and DEL500 are inactive, e.g. low. When signal FASTSCSI is low, signal DEL125 on line 651 is driven low while the input signals to AND gates 664 and 666 are driven high by inverter 663. Hence the signals on lines 631 and 641 depend on signal DFPEXP.

Signal DFPEXP on input line 668 drives a second input terminal of AND gate 666 and an inverter 665 that in turn drives a second input terminal of AND gate 664. If signal DFPEXP is high and signal FASTSCSI is low, signal DEL625 on line 631 goes high while signal DEL500 on line 641 goes low and appears as a low signal at the second input terminal of AND gate 664. Alternatively, if signal DFPEXP is low, a low signal appears at line 631 and a high signal appears at line 641.

In this manner one of three lines 631, 641 and 651 has a high signal while the other two lines have a low signal, depending on the state of signals FASTSCSI and DFPEXP. In one embodiment, signal FASTSCSI is derived from a value of the transmission speed which is stored in a register of the receiver. In one embodiment, signal DFPEXP is determined by a user through a user accessible bit in a hardware register.

In this embodiment, hardware register 670 in host adapter 203 (FIG. 2A) includes user selectable bit 671 and bit 672. Circuitry in host adapter 203 (not shown in FIG. 2A) drives signal DFPEXP high when bit 671 of hardware register 670 is set and drives signal DFPEXP low when bit 671 is clear. The coupling of bit 671 to filter period expansion line 668 is represented by the broken line in FIG. 6B. Also, bit 672 is set for fast SCSI operations. Bit 672 is coupled to FASTSCSI input line 667.

Table 1 illustrates the operation of the logic illustrated in FIG. 6B. In view of this disclosure the logic to implement Table 1 can be generated by logic gate combinations other than those shown in FIG. 6B.

TABLE 1

| DFON | DFPEXP | TRANSFER RATE | MIN. FILTER PERIOD | MAX. FILTER PERIOD |
| --- | --- | --- | --- | --- |
| 0 | X | — | 0 ns | 0 ns |
| 1 | X | >5.0 MBytes/sec | 12.5 ns | 25.0 ns |
| 1 | 0 | <5 MBytes/sec | 50.0 ns | 62.5 ns |
| 1 | 1 | <5 MBytes/sec | 62.5 ns | 75.0 ns |

Referring to FIG. 7, when signal Q3 goes high at time t7, MUX 610 (FIG. 6A) drives line 611 high (because signal CLKBWONB on line 571 is low). A high signal on line 611 drives signal EOF500 on line 435 high (because signal DEL500 on line 641 is high due to default). A high signal EOF500 in line 435 drives signal RST- low.

When signal RST- goes low, flip-flop 340 is reset which causes signal NTRIG to go high and signal TRIG to go low. Also, when signal RST- goes low, flip-flop 420 or 410 is reset which drives signal NCLKBWON or CLKBWON low. Moreover, when signal RST- goes low, inverter 454 drives the signal at B input of OR gate 456 high. In response, OR gate 456 drives signal DEACT- on line 222 high and simultaneously through inverter 458 and buffer 459, signal DEACT on line 223 low (see time t7 in FIG. 7). Therefore signal EXTSIG- from line 312 appears as signal INTSIG-. Any variations in signal EXTSIG- are now seen in signal INTSIG-, until another rising edge. At time t9 (FIG. 7) a falling edge occurs in signal EXTSIG- which results in signal INTSIG- also going low, because signal EXTSIG- is being directly passed as signal INTSIG-.

In one embodiment, signal CLK has a frequency of 40 MHz with a half clock cycle of 12.5 nanoseconds which is used as the filter period for fast SCSI transmission speed. The default for signal DFPEXP is low, which indicates a minimum filter period of 50 nanoseconds. Two clock cycles represent a minimum filter period of 50 nanoseconds and this is used for normal SCSI transmissions. A user can expand the minimum filter period to 62.5 nanoseconds (two-and-half clock cycles) by setting DFPEXP bit 671 in hardware register 670 (FIG. 6C). A user may set DFPEXP bit 671 for example, to debug transmission problems.

Although a filter period of 12.5 nanoseconds is normally used for fast SCSI transmissions, the resolution for fast SCSI is between 12.5 and 25 nanoseconds because, as noted above, a rising edge may occur during a setup interval before a clock edge. Similarly, the filter period for normal SCSI transmissions has a resolution of 50 to 62.5 nanoseconds and the expanded filter period has a resolution of 62.5 to 75.0 nanoseconds (Table 1).

In one embodiment, the time domain signal filter is implemented on SCSI host adapter 131 for only the signal line REQ of the SCSI bus. The SCSI bus signal line REQ is connected to terminal EXTSIG- of time domain signal filter shown in FIG. 4. Although signal line REQ of the SCSI bus is shown connected to terminal EXTSIG-, any other line of the SCSI bus can be connected in accordance with this invention. A receiver is more sensitive to false assertions on signal line REQ than the other lines of the SCSI bus because the signals on signal line REQ are used by the receiver to increment counters. Signals on the other signal lines of the SCSI bus are not used by a receiver to increment counters, and therefore the receiver is less sensitive to the other signals. Providing a time domain signal filter 204 for only signal line REQ has the important advantages of savings in die size and cost while eliminating the problem of false triggering of a receiver indicating receipt of multiple messages.

In one embodiment, the time domain signal filter is implemented in a 0.8 micron double metal CMOS process.

Although the present invention has been described in connection with the above described illustrative embodiments, the present invention is not limited thereto. For example instead of filtering the SCSI signal on the REQ signal line, a time domain signal filter can filter other SCSI signals or a time domain signal filter can filter each and every SCSI signal. Also, instead of SCSI interface, a different interface can be used in accordance with this invention. Also, the time domain signal filter can be used in the target device, although the present invention has been described with a host adapter in a computer as the receiver. Various modifications and adaptations of the above discussed embodiment are encompassed by this invention as set forth in the appended claims.

What is claimed is:

1. A time domain signal filter comprising:
   a signal replacement circuit having:
      a signal replacement circuit input line,
      a first signal replacement circuit output terminal and
      a second signal replacement circuit output terminal,
      wherein in response to a predetermined signal change on said signal replacement circuit input line, said signal replacement circuit generates an active signal on said first signal replacement circuit output terminal for a predetermined time period; and
   a signal switching circuit having:
      a first signal switching circuit input line connected to said first signal replacement circuit input line,
      a second signal switching circuit input line connected to said first signal replacement circuit output terminal,
      a third signal switching circuit input line connected to said second signal replacement circuit output terminal, and
      a signal switching circuit output terminal,
         wherein said signal switching circuit disconnects said first signal switching circuit input line from said signal switching circuit output terminal and connects said third signal switching circuit input line to said signal switching circuit output terminal for said predetermined time period in response to said active signal on said second signal switching circuit input line; and further wherein said predetermined signal change occurs at least from a first signal level to a second signal level.

2. The time domain signal filter of claim 1 wherein said signal replacement circuit comprises:

a trigger circuit comprising said signal replacement circuit input line and a trigger circuit output terminal, wherein in response to said predetermined signal change said trigger circuit generates an active signal on said trigger circuit output terminal; and a signal generation circuit comprising (i) a signal generation circuit input line connected to said trigger circuit output terminal, and (ii) said first signal replacement circuit output terminal, wherein in response to an active signal on said signal generation circuit input line, said signal generation circuit generates said active signal on said first signal replacement circuit output terminal for said predetermined time period.

3. The time domain signal filter of claim 2 wherein said signal generation circuit further comprising a signal generation circuit output terminal and wherein said trigger circuit further comprises a reset trigger circuit input line connected to said signal generation circuit output terminal, wherein said signal generation circuit generates an active signal on said signal generation circuit output terminal after passage of said predetermined time period, and further wherein said trigger circuit drives a signal on said trigger circuit output terminal inactive in response to an active signal on said reset trigger circuit input line.

4. The time domain signal filter of claim 2, wherein said predetermined time period is determined by said signal generation circuit from a signal on a filter period expansion line.

5. The time domain signal filter of claim 2 wherein said trigger circuit comprises a flip-flop having a clock input terminal, said signal replacement circuit input line being connected to said clock input terminal of said flip-flop.

6. The time domain signal filter of claim 2 wherein said signal generation circuit comprises a first flip-flop and a second flip-flop, said first flip-flop being clocked by a first clock signal, said second flip-flop being clocked by an inverse of said first clock signal, wherein said first flip-flop has a first flip-flop input terminal and said second flip-flop has a second flip-flop input terminal, and wherein said signal generation circuit input line is coupled to said first flip-flop input terminal and to said second flip-flop input terminal.

7. The time domain signal filter of claim 6 wherein a reset terminal of said second flip-flop is coupled to an output terminal of said first flip-flop so that if said first flip-flop is clocked before said second flip-flop, said first flip-flop holds said second flip-flop in reset.

8. The time domain signal filter of claim 6, wherein said first flip-flop has a first flip-flop output terminal and wherein said signal generation circuit further comprises a timer circuit having a timer input line connected to said first flip-flop output terminal.

9. The time domain signal filter of claim 8 wherein said timer circuit comprises a plurality of timer stages each timer stage having a timer stage input line and a timer stage output terminal, a first timer stage of said plurality of timer stages comprising said timer stage input line of said timer circuit and said timer stage output terminal being connected to timer stage input line of a second timer stage of said plurality of timer stages.

10. The time domain signal filter of claim 9 wherein each of said timer stages comprises a flip-flop.

11. The time domain signal filter of claim 10 further comprising first and second clock input lines wherein said first clock input line is connected to a first timer stage and said second clock input line is connected to a second timer stage.

12. The time domain signal filter of claim 1 wherein said first signal switching circuit input line is connected to a line of a SCSI bus.

13. The time domain signal filter of claim 12 wherein said SCSI bus comprises a line (REQ) and said first signal switching circuit input line is connected to said line (REQ).

14. A time domain signal filter comprising:

a signal replacement circuit having:
a signal replacement circuit input line,
a first signal replacement circuit output terminal,
a second signal replacement circuit output terminal,
wherein in response to a predetermined signal change on said signal replacement circuit input line, said signal replacement circuit generates an active signal on said first signal replacement circuit output terminal for a predetermined time period;

a signal switching circuit having:
a first signal switching circuit input line connected to said first signal replacement circuit input line,
a second signal switching circuit input line connected to said first signal replacement circuit output terminal,
a third signal switching circuit input line connected to said second signal replacement circuit output terminal, and
a signal switching circuit output terminal,
wherein said signal switching circuit disconnects said first signal switching circuit input line from said signal switching circuit output terminal and connects said third signal switching input line to said signal switching output terminal for said predetermined time period in response to said active signal on said second signal switching circuit input line; and
wherein said signal switching circuit comprises a delay circuit having a delay circuit input terminal and a delay circuit output, said first signal switching circuit input line being connected to said delay circuit input terminal and further wherein said delay circuit passes a signal received on said delay circuit input terminal to said delay circuit output terminal after a delay.

15. The time domain signal filter of claim 14 wherein said signal replacement circuit comprises:

a trigger circuit comprising said signal replacement circuit input line and a trigger circuit output terminal, wherein in response to said predetermined signal change said trigger circuit generates an active signal on said trigger circuit output terminal; and a signal generation circuit comprising (i) a signal generation circuit input line connected to said trigger circuit output terminal, and (ii) said first signal replacement circuit output terminal, wherein in response to an active signal on said signal generation circuit input line, said signal generation circuit generates said active signal on said first signal replacement circuit output terminal for said predetermined time period.

16. The time domain signal filter of claim 14 wherein said first signal switching circuit input line is connected to a line of a SCSI bus.

17. The time domain signal filter of claim 16 wherein said SCSI bus comprises a line (REQ) and said first signal switching circuit input line is connected to said line (REQ).

18. The time domain signal filter of claim 1 or 14 wherein said second signal on said signal replacement circuit output terminal is inverse of said third signal.

19. A method of filtering a first signal comprising:

passing said first signal onto a signal switching circuit output terminal;

detecting a predetermined signal change in said first signal received on a signal replacement circuit input line, wherein said predetermined signal change is at least from a first signal level to a second signal level;

generating a second signal for a predetermined time period on a first signal replacement circuit output terminal;

switching from passing said first signal to passing a third signal from a second signal replacement circuit output terminal onto said signal switching circuit output terminal for said predetermined time period in response to said second signal; and switching from passing said third signal to said first signal onto said signal switching circuit output terminal after passage of said predetermined period.

20. The method of claim 19 further comprising determining passage of said predetermined period from first occurrence of an edge in a clock signal after detecting said predetermined signal change.

21. The method of claim 20 further comprising wherein said predetermined period is determined by a signal on a filter period expansion line.

* * * * *